(12) United States Patent
Chien et al.

(10) Patent No.: US 6,248,608 B1
(45) Date of Patent: Jun. 19, 2001

(54) MANUFACTURING METHOD OF A GALLIUM NITRIDE-BASED BLUE LIGHT EMITTING DIODE (LED) OHMIC ELECTRODES

(75) Inventors: Fen-Ren Chien, Yung-Ho; Lung-Chien Chen, Hsin-Chuang; Yi-Tsung Chang, Pei-Tou Area, all of (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 0 days.

(21) Appl. No.: 09/653,496

(22) Filed: Aug. 31, 2000

(51) Int. Cl.⁷ ................................................. H01L 21/00
(52) U.S. Cl. ............................................................ 438/46
(58) Field of Search .................................. 438/46, 47, 28, 438/29, 34, 35, 45, 141

(56) References Cited

U.S. PATENT DOCUMENTS 5,563,422 10/1996 Nakamura et al. .

FOREIGN PATENT DOCUMENTS

06232450 * 8/1994 (JP) ................................ H01L/33/00
11177134 * 6/1999 (JP) ................................ H01L/21/28

* cited by examiner

Primary Examiner—Charles Bowers
Assistant Examiner—Craig Thompson

(57) ABSTRACT

A manufacturing method and its structure of a gallium nitride-based blue light emitting diode (LED) ohmic electrodes and a transparent conductive layer (TCL), which forms a thin composite layer upon P type gallium nitride and a composite thin film ohmic electrodes upon P type gallium nitride epitaxial layer and N type gallium nitride epitaxial layer, respectively. Heat treatment is applied to said composite thin film layer and composite thin film ohmic electrodes to obtain the optimized ohmic properties and transparency so as to uniformly disperse the injected current throughout the N type electrode.

15 Claims, 5 Drawing Sheets

MANUFACTURING METHOD OF A GALLIUM NITRIDE-BASED BLUE LIGHT EMITTING DIODE (LED) OHMIC ELECTRODES

FIELD OF THE INVENTION

This invention is related to a manufacturing method of a gallium nitride(GaN)-based blue light emitting diode (LED) ohmic electrodes and a transparent conductive layer (TCL). More specifically, it's related to a ohmic electrode and a transparent conductive layer which forms a thin composite layer upon P type gallium nitride epitaxial layer.

BACKGROUND OF THE INVENTION

U.S. Pat. No. 5,563,422 discloses a series of manufacturing method regarding gallium nitride(GaN)-based III–V compound semiconductor devices and techniques of ohmic electrodes. FIG. 1 shows the dissection of said patented invention, which is about making a gallium nitride(GaN)-based III–V compound semiconductor light emitting diode 110 with P type electrode 115 and N type electrode 114. It contains: a substrate 111; a semiconductor stacking structure above that substrate with a N type gallium nitride(N-GaN) 112-based III–V compound semiconductor and a P type gallium nitride(P-GaN)113-based III–V compound semiconductor; a N type electrode(first electrode) 114 making said N type semiconductor layer in contact; a P type electrode(second electrode) 115 making said N type semiconductor layer in contact; and a pad 116 above the second electrode 115.

The second electrode 115(P type electrode) contacts to P type semiconductor 113 by forming a metallic material layer such as gold/nickel (Au/Ni) and annealing the metallic material layers.

Among said gallium nitride (GaN)-based III–V compound semiconductor devices, the second electrode 115 includes Ti/Al or Au, the second electrode 115 contains one or more metallic alloy selected from the group of gold, nickel, aluminum, platinum, tin, indium, chromium and titanium, in which gold/nickel alloy has better effects.

Even the second electrode 115 is made of gold/nickel; its resistance between electrodes is 1 k$\Omega$, therefore, this invention offers a manufacturing method of the ohmic electrodes and the transparent conductive layer to lower serial resistance between the electrode and the gallium nitride.

SUMMARY OF THE INVENTION

The main purpose of this invention is to provide a manufacturing method of a gallium nitride(GaN)-based blue light emitting diode (LED) ohmic electrodes. Since the contacting resistance between the nickel chromium (NiCr) alloy and P type gallium nitride epitaxial layer is relatively low, a thin film alloy electrode can be grown upon the P-GaN epitaxial layer and N-GaN epitaxial layer. Moreover, better ohmic property is obtained by applying appropriate heat treatment to reduce the serial resistance between the electrodes and the P type and N type gallium nitride epitaxial layers and, in the same time, to lower the forward voltage of the light emitting diode.

Another purpose of the current invention is to offer a manufacturing method of a transparent conductive layer of a gallium nitride(GaN)-basedlight emitting diode made from NiCr alloy. By growing a layer of NiCr thin film upon P type gallium nitride epitaxial layer, and applying appropriate heat treatment on said alloy thin film to obtain better ohmic property and transparency. Since said alloy thin film is highly transparent in the wavelength range (400–700 nm) of visible light, its average transparency is 87.77%, which offers larger current-injecting area. The optimized transparency also improves its luminance.

DETAILED DESCRIPTION OF PREFERRED EMBODIMENTS

All the growth of semiconductor layer is carried out with metalorganic chemical vapor deposition (MOCVD) techniques and the III–V alloy semiconductor of the gallium nitride-based are nitride semiconductor of III-valance element gallium.

Figure 1:
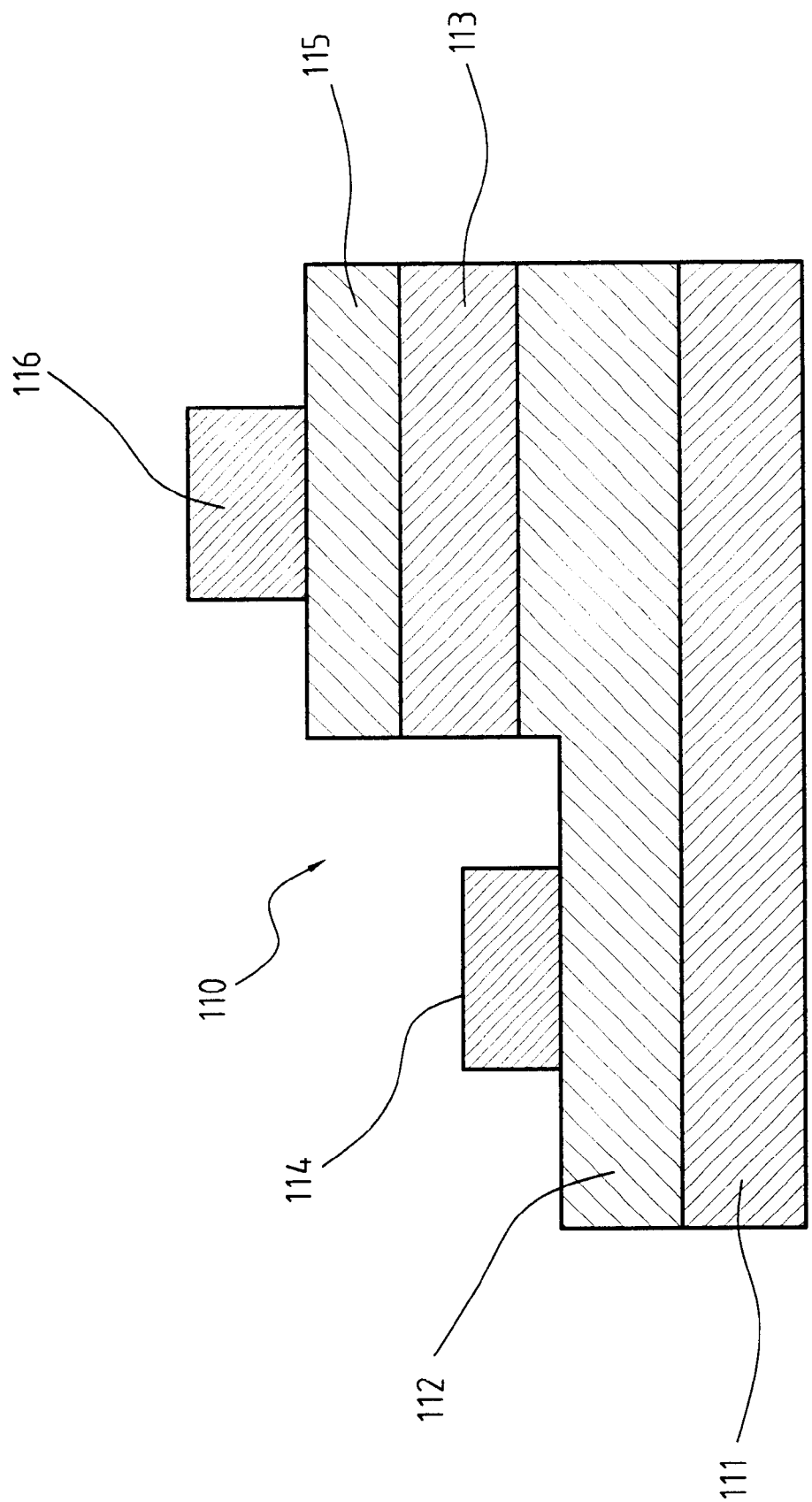
FIG. 1 is the dissection of the structure of the known gallium nitride (GaN) blue light emitting diode.
Figure 2:
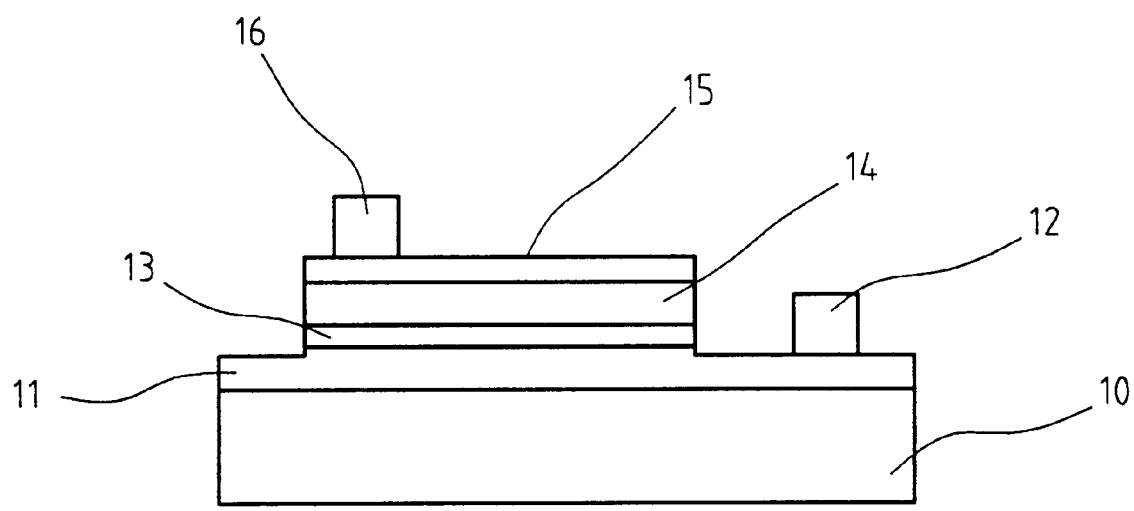
FIG. 2 is the dissection of the structure of the gallium nitride-based blue light emitting diode ohmic electrode and transparent contacting electrical conducting layer, in according to present invention.

As shown in FIG. 2, common techniques of the light emitting diode displays adopt surface emitting structure, they are sapphire ($Al_2O_3$) substrate layer 10, N type gallium nitride layer 11, N-electrode layer 12, active layer 13, P type gallium nitride layer 14, transparent electrode layer 15 and P-electrode layer 16.

This invention mainly is that there grows an alloy metallic thin film layer upon the P type gallium nitride layer 14 as shown in FIG. 2 to effectively disperse the injected current and take the advantage of its transparency to enhance the luminance. Examples are illustrated in the following,

EXAMPLE 1

For the sake of easier measurement of the contact resistance of P-electrode and surface resistance, the example of this invention is directly grow P type gallium nitride film layer upon sapphire C-face substrate using metalorganic chemical vapor deposition. (MOCVD)

As sown in FIG. 2, a GaN epitaxial layer is grown upon the sapphire 10 C-face substrate at about 1000° C. Since the magnesium (Mg) molecules haven't diffused into the crystalline lattice of the newly grown GaN crystal yet, Mg cannot be activated as an acceptor. The said gallium nitride eptixial layer is not a P type gallium nitride layer 14 but an epitaxial layer with high electrical resistance. Therefore, a process of rapid thermal annealing of 850° C. and 10 minutes needs to be applied to activate the epitaxial layer to be a P type gallium nitride layer 14.

Using Hall system, the sheet resistance of the P type gallium nitride layer 14 ($R_s$) is $1.9 \times 10^4 \Omega/\square$, the mobility ($\mu$) is 13.21 cm$^2$/V-s, concentration (p) is $1.26 \times 10^{17}$ cm$^{-3}$.

Figure 3:
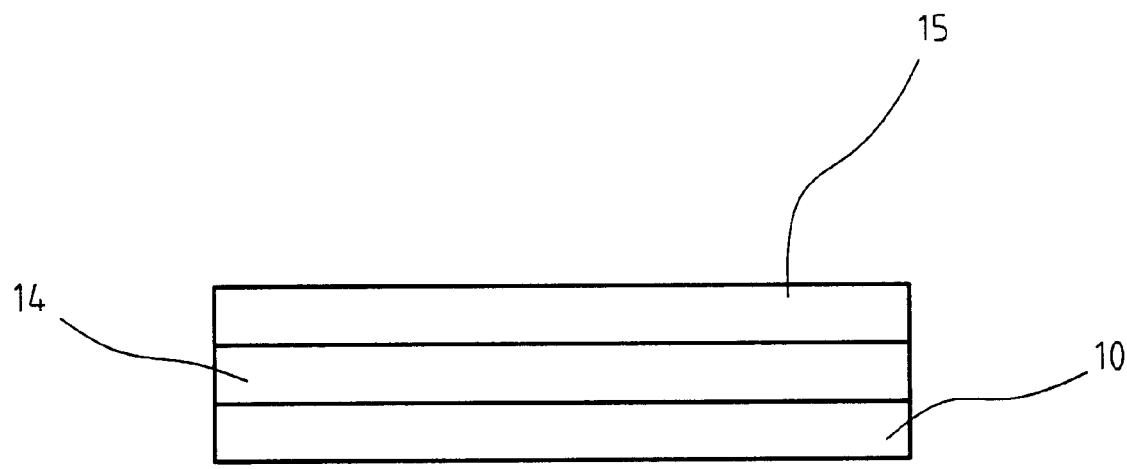
FIG. 3 is the circular transmission line model of the structure of the invented gallium nitride-based blue light emitting diode ohmic electrode and transparent contacting electrical conducting layer, in according to present invention.
Figure 4:
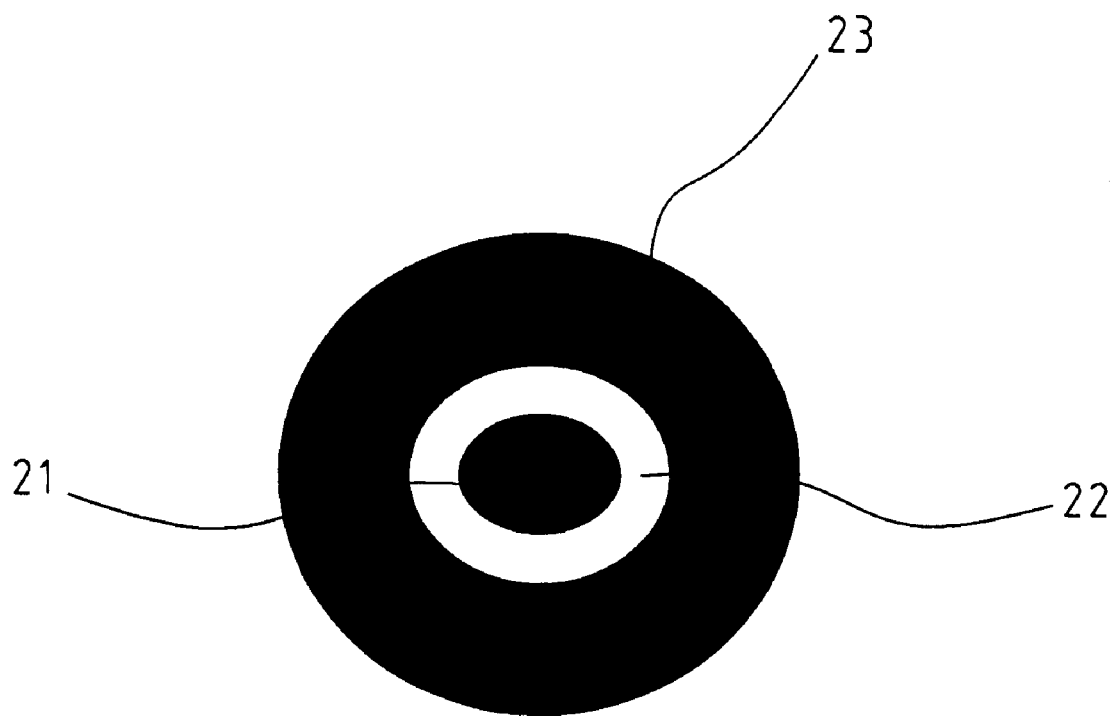
FIG. 4 is the circular transmission line model of the structure of the invented gallium nitride-based blue light emitting diode ohmic electrode and transparent contacting electrical conducting layer, in according to present invention.

In FIG. 2, a circular transmission line model above the P type gallium nitride layer 14, as shown in FIG. 4, is fabricated by photolithography, and then use Cr-Ni alloy (80% nickel and 20% chromium) as the material of vapor deposition. Under the pressure condition of $1.2 \times 10^{-5}$ torr, vapor is being deposited upon P type gallium nitride layer 14 and results in a metallic thin film layer 15 as shown in FIG. 3, said film thickness is controlled at around 100 angstrom. The circular transmission line model metal thin film, as shown in FIG. 4, is formed through the techniques of lifting-off.

Figure 5:
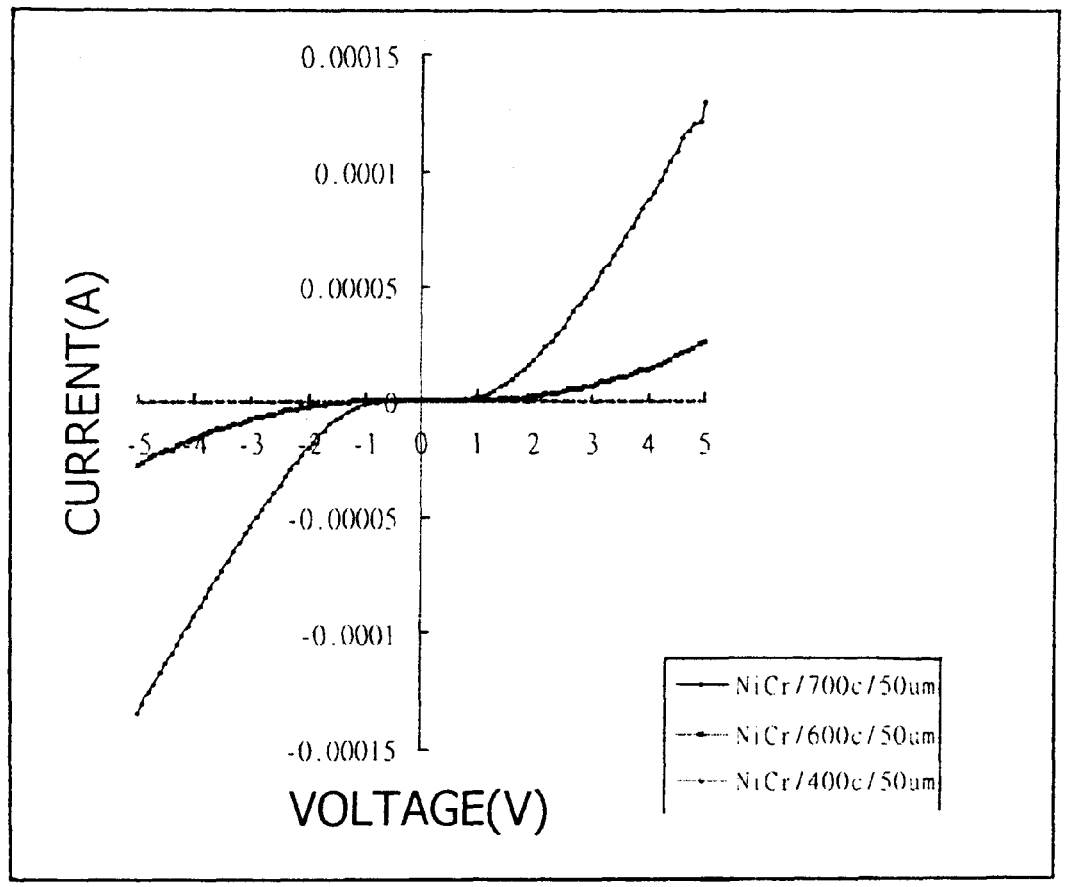
FIG. 5 is the current-voltage characteristic curves of the invented gallium nitride-based blue light emitting diode ohmic electrode and transparent contacting electrical conducting layer after 60 seconds heat treatment under different temperature conditions, in according to present invention.

Among the samples of the circular transmission line model as shown in FIG. 4, the circular gap 22 has 9 different sizes, which are 3, 5, 7, 9, 15, 20, 25, 30 and 50 micrometer, respectively. The metallic thin film 21, 23 are the electrodes used to measure current-voltage characteristic curves. The conditions and results of the measurement are shown in FIG. 5, which is also the current-voltage characteristic curve after 400~700° C. heat treatment for 60 seconds.

When measuring the current-voltage characteristic curve, the circular gap 22 is 50 micrometer, a better ohmic property can be obtained with above results, and circular transmission line model principle can be used to obtain contacting resistance ($\rho_c$) of $4.83 \times 10^{-2}$ $\square$-cm$^2$.

Figure 6:
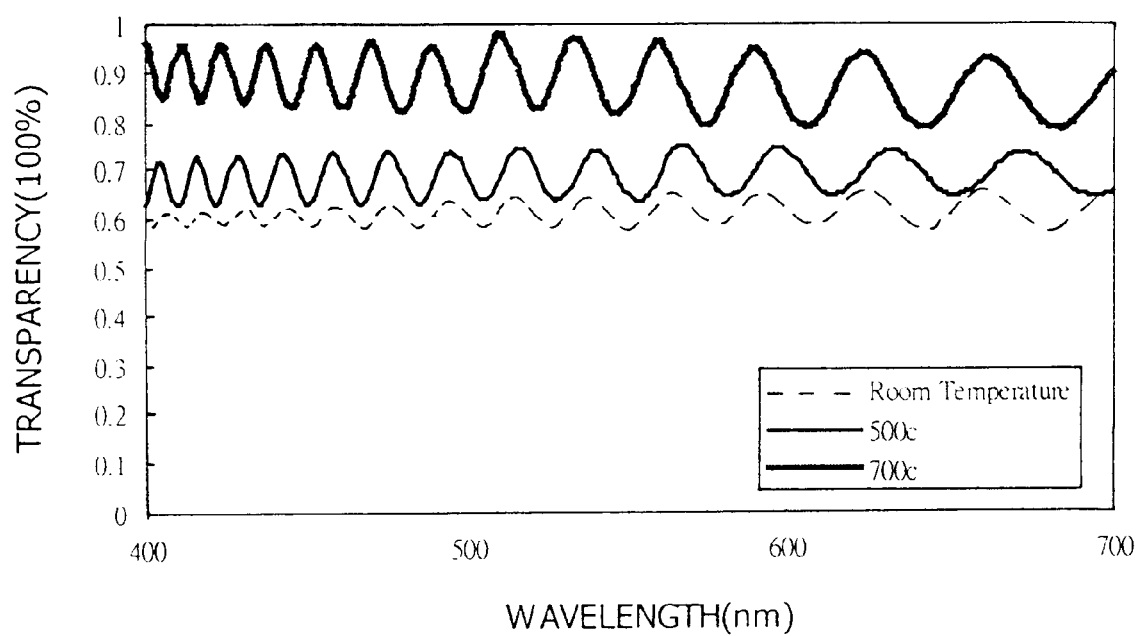
FIG. 6 is the transmission plot (with various visible light wavelengths) of the alloy thin film of the invented gallium nitride-based blue light emitting diode ohmic electrode and transparent contacting electrical conducting layer after 60 seconds heat treatment under different temperature conditions.

Finally, physical deposits a NiCr alloy thin film with thickness of 100 angstrom upon another P type gallium nitride which is against the metallic thin film layer 15 and P type gallium nitride layer 14, as shown in FIG. 3; and then treats it with room temperature and 500~700° C. heat treatment for 60 seconds. Spectrophotometer measurements show the transparency of the metallic thin film at wavelength of 450 nm are 58.82%, 63.1%, 92.65%, as shown in FIG. 6. Therefore, from the above example, the metallic thin film obtains better ohmic property and transparency after 700° C./60 seconds heat treatment.

Although the above example describes a transparent electrode manufacturing method of P type gallium nitride using sapphire as the substrate and physical deposits NiCr alloy thin film, said invention can be applied to the gallium nitride light emitting diode in the wavelength range of the visible light.

The invention has been described herein with reference to certain preferred embodiments. However, as obvious variants thereon will become apparent to those skilled in the art, the invention is opt to be considered as limited thereto.

What is claimed is:

1. A manufacturing method of a gallium nitride(GaN)-based blue light emitting diode (LED) ohmic electrodes, comprising the steps of:
   a. growing an alloy thin film upon a P type gallium nitride epitaxial layer;
   b. using lift-off techniques to obtain a circular transmission line model pattern made from the alloy thin film;
   c. heat treating the alloy thin film of the circular transmission line model pattern to obtain a better ohmic property;
      wherein the lower contacting electrical resistance between the alloy and the P type gallium nitride epitaxial layers decreases the serial electrical resistance between the P-GaN gallium nitride epitaxial layer and N-GaN gallium nitride epitaxial layer and lowers forward breakover voltage of the light emitting diode.

2. A manufacturing method of a gallium nitride(GaN)-based blue light emitting diode (LED) ohmic electrodes according to claim 1, wherein the vacuum pressure in growing said circular transmission line model alloy thin film is $1.2 \times 10^{-5}$ torr.

3. A manufacturing method of a gallium nitride(GaN)-based blue light emitting diode (LED) ohmic electrodes according to claim 1, wherein the better temperature in heat treating said circular transmission line model alloy thin film is 400–700° C.

4. A manufacturing method of a gallium nitride(GaN)-based blue light emitting diode (LED) ohmic electrodes according to claim 1, wherein the material of the said circular transmission line model alloy thin film is NiCr alloy.

5. A manufacturing method of a gallium nitride(GaN)-based blue light emitting diode (LED) ohmic electrodes according to claim 1, wherein the composition of the nickel in the said NiCr alloy is 1% to 99%.

6. A manufacturing method of a gallium nitride(GaN)-based blue light emitting diode (LED) transparent conductive layer, comprising the steps of:
   a. growing an alloy thin film upon the P type gallium nitride epitaxial layer;
   b. heat treating the thin film alloy, which makes the said alloy thin film be a transparent contacting electrical conducting layer and have a better ohmic property and transparency;
      wherein the better transparency and ohmic property of the said transparent conductive layer increases the area of the injected current, which makes the injected current effectively and uniformly disperses through the N-electrode.

7. A manufacturing method of a gallium nitride(GaN)-based blue light emitting diode (LED) transparent conductive layer according to claim 6, wherein the said alloy thin film is grown by way of evaporation.

8. A manufacturing method of a gallium nitride(GaN)-based blue light emitting diode (LED) transparent conductive layer according to claim 6, wherein the said alloy thin film is grown by way of sputtering.

9. A manufacturing method of a gallium nitride(GaN)-based blue light emitting diode (LED) transparent conductive layer according to claim 6, wherein the said alloy thin film is grown by way of electron beam evaporation.

10. A manufacturing method of a gallium nitride(GaN)-based blue light emitting diode (LED) transparent conductive layer according to claim 6, wherein the material of the said contacting thin film is NiCr alloy.

11. A manufacturing method of a gallium nitride(GaN)-based blue light emitting diode (LED) transparent conductive layer according to claim 6, wherein the better heat treatment temperature of the said alloy thin film is 400–700° C.

12. A manufacturing method of a gallium nitride(GaN)-based blue light emitting diode (LED) transparent conductive layer according to claim 7, wherein the better heat treatment temperature of the said alloy thin film is 400–700° C.

13. A manufacturing method of a gallium nitride(GaN)-based blue light emitting diode (LED) transparent conductive layer according to claim 8, wherein the better heat treatment temperature of the said alloy thin film is 400–700° C.

14. A manufacturing method of a gallium nitride(GaN)-based blue light emitting diode (LED) transparent conductive layer according to claim 9, wherein the better heat treatment temperature of the said alloy thin film is 500–700° C.

15. A manufacturing method of a gallium nitride(GaN)-based blue light emitting diode (LED) transparent conductive layer according to claim 10, wherein the composition of the nickel in the said NiCr alloy is 1% to 99%.

* * * * *